United States Patent
Struck et al.

[11] Patent Number: 5,933,198
[45] Date of Patent: Aug. 3, 1999

[54] COMB FILTER ARRANGEMENT

[75] Inventors: Sönke Struck, Neu Wulmstorf; Ole Steinfatt, Buchholz, both of Germany

[73] Assignee: U.S. Philips Corporation, New York, N.Y.

[21] Appl. No.: 08/798,345

[22] Filed: Feb. 10, 1997

[30] Foreign Application Priority Data

Feb. 10, 1996 [DE] Germany .......................... 196 04 929

[51] Int. Cl.$^6$ .............................. H04N 9/77; H04N 5/21; H04N 5/213; H04N 5/217; H04N 9/78
[52] U.S. Cl. .......................... 348/663; 348/610; 348/665; 348/667
[58] Field of Search .................................... 348/609, 610, 348/653, 654, 665, 667, 708, 710, 663, 666, 668, 669, 912, 913, 914; 364/724.19; 386/3, 25, 47; H04N 9/78

[56] References Cited

U.S. PATENT DOCUMENTS

| | | | |
|---|---|---|---|
| 4,179,705 | 12/1979 | Faroudja | 358/31 |
| 4,731,660 | 3/1988 | Faroudja et al. | 358/31 |
| 4,847,681 | 7/1989 | Faroudja et al. | 358/37 |
| 5,012,143 | 4/1991 | Boudewijns | 307/606 |
| 5,260,775 | 11/1993 | Faroundja | 358/36 |
| 5,420,643 | 5/1995 | Romesberg et al. | 348/581 |
| 5,661,679 | 8/1997 | Struck | 365/149 |

*Primary Examiner*—John K. Peng
*Assistant Examiner*—Eric Ferguson
*Attorney, Agent, or Firm*—Edward W. Goodman

[57] ABSTRACT

For activating or deactivating the comb filter function with pixel precision, a comb filter arrangement including a delay circuit (3) and a first matching circuit (1) having at least two storage cells, these circuits receive a picture signal, having a sequence of individual pixels applied to the comb filter arrangement. The output signals of the delay circuit and the first matching circuit are superposed by a superposition stage (4) supplying a filtered picture signal from its output. The matching circuit (1) is implemented in such a way that it gives the picture signal applied thereto substantially the same amplitude variations as the delay circuit (3), and that the difference between the delay of the output signals from the delay circuit (3) and the matching circuit (1) corresponds to a nominal value. The comb filter arrangement further includes a second matching circuit (2) and a switching circuit (6), the unfiltered picture signal being applied to the input of the second matching circuit (2) which gives the picture signal substantially the same amplitude variations and delays as the first matching circuit (1), and the switching circuit, for switching the comb filter function on and off, alternately deactivating either the second matching circuit (2) or the delay circuit (3).

9 Claims, 1 Drawing Sheet

COMB FILTER ARRANGEMENT

BACKGROUND OF THE INVENTION

1. Field of the Invention

The invention relates to a comb filter arrangement comprising a delay circuit and a first matching circuit having at least two storage cells, these circuits receiving a picture signal comprising a sequence of individual pixels applied to the comb filter arrangement and whose output signals are superposed by means of a superposition stage supplying a filtered picture signal from its output, the matching circuit being implemented in such a way that it gives the picture signal applied thereto substantially the same amplitude variations as the delay circuit, and that the difference between the delay of the output signals from the delay circuit and those from the matching circuit corresponds to a nominal value.

2. Description of the Related Art

Such comb filter arrangements are used in television receivers or video recorders. Glass fiber delay lines or CCD cells (Charge-Coupled Devices) are used as delay circuits for this purpose.

For an even further improved picture quality and a more precise processing of the picture signal, it is often desirable to switch such comb filter arrangements on and off temporally or, ideally, pixel-sequentially. However, the known comb filter arrangements are not suitable for this purpose, because the mode of operation of a delay circuit does not render it possible to switch it off, or because an amplification error results at the output of the comb filter arrangement when the delay circuit is switched off, as only the signal supplied by the matching circuit is applied to the superposition stage when the delay circuit is switched off. Consequently, amplitude and amplification errors are produced in those signal components which are supplied by the matching circuit and the delay circuit, and are normally superposed at the same phase.

SUMMARY OF THE INVENTION

It is an object of the invention to provide a comb filter arrangement allowing the comb filter function to be switched on and off without amplification and/or phase errors of its output signal.

According to the invention, this object is solved in that a second matching circuit and a switching circuit are provided, in that the unfiltered picture signal is applied to the input of the second matching circuit which gives the picture signal substantially the same amplitude variations and delays as the first matching circuit, and in that the switching circuit for switching the comb filter function on and off alternately deactivates either the second matching circuit or the delay circuit.

The comb filter arrangement according to the invention comprises two matching circuits and one delay circuit. For the comb filter function, the superposition stage receives the output signal from the first matching circuit and the delay circuit. To this end the switching circuit switches off the second matching circuit and switches on the delay circuit. The normal comb filter function is given in this mode of operation. For example, the delay circuit may delay the input signal applied thereto by about two picture lines, so that these applied signals are superposed in the superposition stage while being delayed by about a time difference of two picture lines. The second matching circuit is provided because, for technical reasons, delay circuits cannot generally be constructed in such a way that they perform an exact time delay of the desired duration, for example a period of two picture lines. To this end, the matching circuits each has such a time delay that the time difference between the output signals of the matching circuits and the delay circuit have the desired time delay relative to each other. Moreover, the matching circuit is constructed in such a way that it gives the signal applied thereto the same amplitude error as may be done by the delay circuit with the signal applied to this circuit.

In addition to this mode of operation, the comb filter arrangement according to the invention provides the possibility of temporarily switching off the comb filter function. To this end, the switching circuit deactivates the delay circuit and, instead, activates the second matching circuit. Consequently, the two output signals of the first and the second matching circuit are superposed in the superposition stage. These are the signals which are not delayed and those which are delayed by the same value, so that the comb filter function is eliminated. Since the superposition stage receives these two signals of the same phase, no amplitude of amplification errors occur. Similarly as with the comb filter function being switched on, signals of the same phase are superposed with the same phase in the superposition stage, so that no change of amplification or amplitude of the output signal from the superposition stage takes place for these signals during the switching process. This provides the possibility to switch the comb filter function at any time, possibly also within a picture line of the television signal. Moreover, the comb filter arrangement according to the invention does not need to be manually adjusted.

In accordance with further embodiments of the invention, the operation of switching the comb filter function on and off pixel-sequentially may advantageously be performed in such a way that the switching circuit deactivates the delay circuit or the matching circuit in such a way that their storage cells are individually deactivated, so that the comb filter function is switched on and off with pixel precision.

The switching circuit thus activates or deactivates alternately either the storage cells of the delay circuit or of the second matching circuit. The comb filter function can then be switched on and off with pixel precision.

In accordance with a further embodiment of the invention, the delay circuit and the second matching circuit comprise storage cells each having a capacitive storage element, a write transistor by means of which picture signal data can be written into the capacitive storage element via a write line, and a read transistor by means of which information can be read from the capacitive storage element via a read line, each transistor being switched by means of a control signal, while, for individually deactivating the function of individual storage cells, the switching circuit interrupts the control signals applied to the read transistors of the storage cells to be deactivated.

The delay circuits and the matching circuits may be advantageously composed of storage cells each comprising a capacitive storage element in which the information is stored. The write process is performed via a write line whose information is written into the capacitive element via a write transistor. The read process is controlled by means of a read transistor on a read line. The write and read transistors are switched by means of control signals, while for adjacent storage cells the control signal of the storage cell n for the read transistor is preferably identical to the control signal of the write transistor of the storage cell n+1.

For storage cells of the delay circuit and/or the two matching circuits built up in such a way, the comb filter function may be switched on and off by interrupting the control signals for the read transistors in the circuit to be deactivated. The first delay circuit and the second matching circuit can thus be switched on and off pixel-sequentially, i.e. with pixel precision, so that the comb filter function can also be switched with pixel precision.

In a further embodiment of the invention, the control signals for the read transistors can be advantageously interrupted by means of transistors.

These and other aspects of the invention will be apparent from and elucidated with reference to the embodiments described hereinafter.

DESCRIPTION OF THE PREFERRED EMBODIMENTS

Figure 1:
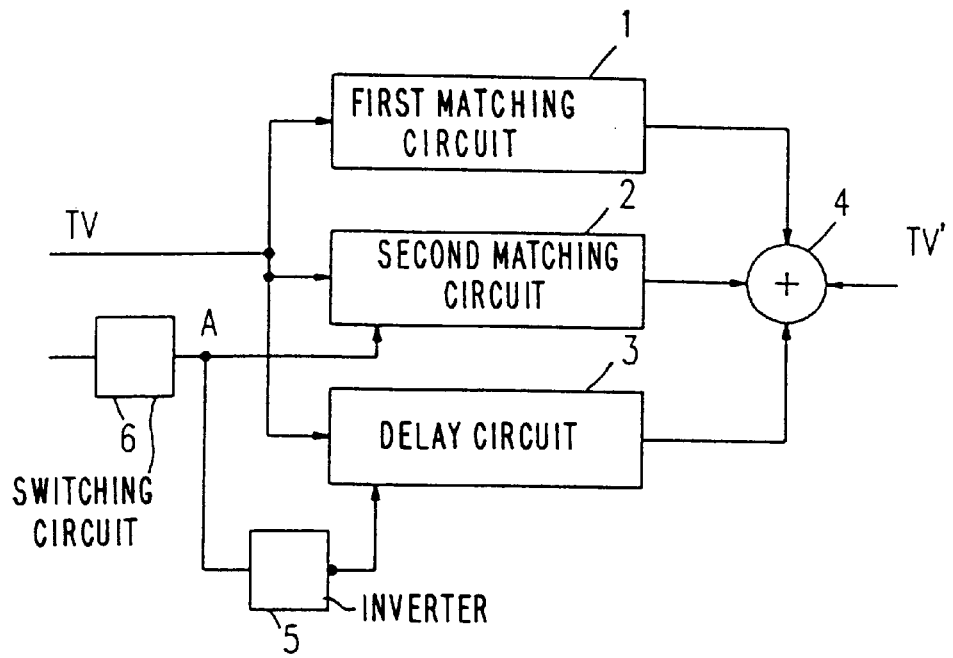
FIG. 1 is a block diagram of an embodiment of the comb filter arrangement according to the invention.

The comb filter arrangement shown in FIG. 1 comprises a first matching circuit 1, a second matching circuit 2 and a delay circuit 3. A picture signal TV applied to the input of the comb filter arrangement is applied to these three circuits.

The outputs of the circuits 1, 2 and 3 are connected to a superposition stage 4 in which the signals applied thereto are additively superposed.

To realize a comb filter operation, for example, the delay circuit 3 for use in video recorders may generate a delay of about two picture lines of the television signal TV. Based on the construction of such a delay circuit, it may not delay the signal applied thereto by a duration of exactly two picture lines. Moreover, it may add amplitude errors to the signal applied thereto.

To compensate for these effects, the first matching circuit 1 and the second matching circuit 2 are constructed in such a way that they add the same amplitude errors to the signal applied thereto as the amplitude error added by the delay circuit 3. Moreover, the two matching circuits 1 and 2 may give the signal such time delays that the output signals of the matching circuits 1 and 2, on the one hand, and the output signal of the delay circuit 3, on the other hand, are superposed with a desired relative time delay (nominal value) in the superposition stage 4. If, for example, the delay circuit 3 does not produce the desired delay by a duration of exactly two picture lines but a delay which is slightly longer, then the matching circuits 1 and 2 may be laid out in such a way that they also produce a shorter delay of the signals applied thereto, so that the superposition in the superposition stage 4 is again realized with a time difference corresponding to the duration of exactly two picture lines.

A further switching circuit 6 generates a signal A which is applied to the second matching circuit 2. The signal A is inverted by means of an inverter 5. The inverted signal A is applied to the delay circuit 3.

For normal comb filter operation, the second matching circuit 2 is deactivated by means of the signal A, whereas the delay circuit 3 is activated. The superposition stage thus receives the output signals of the first matching circuit 1 as well as those of the delay circuit 3. The normal comb filter function is then given and the arrangement supplies a comb-filtered television signal TV' from its output.

When the signal A is deactivated, the second matching circuit 2 is activated and the delay circuit 3 is deactivated. The in-phase signals from the two matching circuits 1 and 2 are then superposed in the superposition stage 4. During these periods of time, the output signal TV' is not comb-filtered and, apart from possibly occurring amplitude errors and a small time delay which may be generated in the matching circuits 1 and 2, corresponds to the input signal TV.

Figure 2:
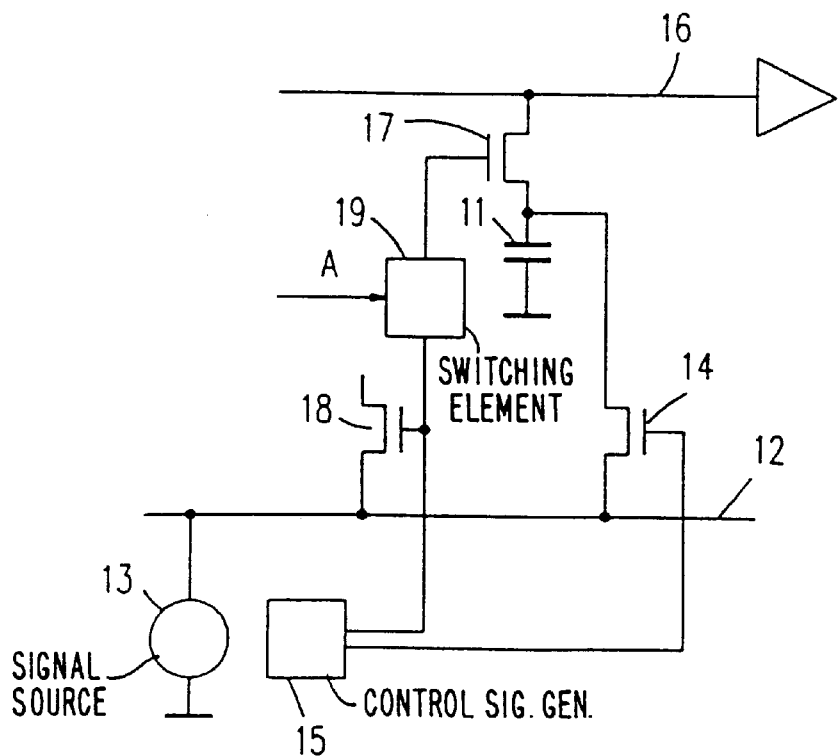
FIG. 2 is a diagram of a storage cell of the delay circuit and/or the second matching circuit of the comb filter arrangement shown in FIG. 1.

The matching circuits 1 and 2 and the delay circuit 3 of the arrangement shown in FIG. 1 may advantageously comprise storage cells, one of which is shown by way of example in FIG. 2. The storage cell shown in FIG. 2 comprises a capacitive storage element 11. A write line 12 is provided, through which, for example, signals can be supplied from a signal source 13. A signal supplied through the write line 12 may be applied to the capacitive storage element 11 via a write transistor 14. To this end, the write transistor 14 is driven by means of a control signal which is generated by means of a control signal generating circuit 15. During normal operation of the storage cell, thus when the information stored in the capacitive storage cell 11 is to be supplied through a read line 16, a read transistor 17, also controlled by a control signal from the control signal generating circuit 15, is activated, via which the information stored in the capacitive storage element 11 is read on the read line 16.

A plurality of such storage cells are arranged side by side in a matching circuit and a delay circuit, with the read line 16 and the write line 12 generally also being common for a group of such storage cells.

The control signals for a read transistor of a storage cell n and a write transistor of a storage cell n+1 are generally identical. This is indicated in FIG. 2 by means of a write transistor 18 which would be associated with a storage cell (not shown in FIG. 2) adjacent to the storage cell shown in FIG. 2.

For activation or deactivation of the comb filter function with pixel precision in the arrangement shown in FIG. 1, storage cells, which are arranged in the second matching circuit 2 and the delay circuit 3 and may be implemented, for example, in accordance with the arrangement shown in FIG. 2, must be activated or deactivated individually. To this end, a switching element 19, receiving an external switching signal A, is provided in the storage cell shown in FIG. 2. If the storage cell shown in FIG. 2 is activated, the switching element 19, controlled by the signal A, allows the control signal supplied by the circuit 15 to pass to the read transistor 17 thereby driving this transistor in the desired manner. The storage cell then supplies an output signal, i.e., the information from the capacitive storage cell 1 1 is applied to the read line 16.

To deactivate the storage cell according to FIG. 2, the control signal supplied by the circuit 15 is blocked by the switching element 19 controlled by the signal A, so that the control signal does not reach the read transistor 17 any longer. Consequently, also the information stored in the capacitive storage element 11 is no longer applied to the read line 16 via the read transistor 17. The storage cell does not supply an output signal.

The second matching circuit 2 and the delay circuit 3 may similarly comprise storage cells as shown in FIG. 2. The difference between the two circuits then is that the information is read from the capacitive element in accordance with the desired delay in the delay circuit, whereas in the second matching circuit, the information is read quasi-directly after the write process.

The storage cells, associated with equal pixels, in the second matching circuit 2 and the delay circuit 3 are switched in an opposite sense, i.e., for example, storage cells associated with a given pixel in the two circuits are switched in such a way that the associated storage cells are either activated in the second matching circuit 2 and deactivated in the delay circuit 3, or deactivated in the second matching circuit 2 and activated in the delay circuit 3. This switching operation with pixel precision may be performed by means of the switching signal A, so that the storage cells can be individually switched on or off.

For the arrangement shown in FIG. 1, this has the advantage that the comb filter function can be activated or deactivated with pixel precision for the signals superposed in the superposition stage 4.

A deactivation of the comb filter function may be desirable, for example, at the vertical edges of the picture signal, because these edges are generally distorted when the comb filter function is activated. A sharper picture impression can be obtained in such areas by way of the precise deactivation of the comb filter function.

We claim:

1. A comb filter arrangement comprising:
   an input for receiving a picture signal comprising a sequence of individual pixels;
   a delay circuit coupled to said input for subjecting said picture signal to amplitude variations and a delay, said delay circuit having at least two storage cells;
   a first matching circuit also coupled to said input for subjecting said picture signal to amplitude variations substantially the same as the amplitude variations in said delay circuit and a delay, a difference between the delay in the delay circuit and the delay in the first matching circuit corresponding to a nominal value; and
   a superposition stage for superposing output signals from said delay circuit and from said first matching circuit to form a filtered picture signal at an output, characterized in that said comb filter arrangement further comprises:
   a second matching circuit also coupled to said input for subjecting said picture signal to amplitude variations and a delay substantially the same as the amplitude variations and the delay in the first matching circuit; and
   a switching circuit for alternately switching on and off a comb filter function of said comb filter arrangement, said switching circuit having outputs coupled, respectively, to a control input of said second matching circuit and to a control input of said delay circuit for alternatively deactivating said second matching circuit and said delay circuit.

2. A comb filter arrangement as claimed in claim 1, characterized in that the switching circuit deactivates the delay circuit deactivate the delay circuit by individually deactivating the storage cells in the delay circuit, whereby the comb filter function is switched on and off with pixel precision.

3. A comb filter arrangement as claimed in claim 2, in which each of the storage cells in the delay circuit comprises a capacitive storage element, a write transistor for writing picture signal data into the capacitive storage element via a write line, and a read transistor for reading information from the capacitive storage element via a read line, each of said write and read transistors being switched by a control signal, characterized in that, for individually deactivating the individual storage cells, each storage cell further comprises means controlled by the switching circuit for interrupting the control signals applied to the read transistors of the storage cells to be deactivated.

4. A comb filter arrangement as claimed in claim 3, characterized in that said interrupting means comprises transistors each associated with a storage cell.

5. A comb filter arrangement as claimed in claim 1, characterized in that the second matching circuit comprises at least two storage cells, and the switching circuit deactivates the second matching circuit by individually deactivating the at least two storage cells, whereby the comb filter function is switched on and off with pixel precision.

6. A comb filter arrangement as claimed in claim 5, wherein each of the storage cells in the second matching circuit comprises a capacitive storage element, a write transistor for writing picture signal data into the capacitive storage element via a write line, and a read transistor for reading information from the capacitive storage element via a read line, each of said write and read transistors being switched by a control signal, characterized in that, for individually deactivating the function of individual storage cells, each of the storage cells further comprises means, controlled by the switching circuit, for interrupting the control signals applied to the read transistors of the storage cells to be deactivated.

7. A comb filter arrangement as claimed in claim 6, characterized in that the interrupting means comprises transistors each associated with a storage cell.

8. A television apparatus including a comb filter arrangement comprising:
   an input for receiving a picture signal comprising a sequence of individual pixels;
   a delay circuit coupled to said input for subjecting said picture signal to amplitude variations and a delay, said delay circuit having at least two storage cells;
   a first matching circuit also coupled to said input for subjecting said picture signal to amplitude variations substantially the same as the amplitude variations in said delay circuit and a delay, a difference between the delay in the delay circuit and the delay in the first matching circuit corresponding to a nominal value; and
   a superposition stage for superposing output signals from said delay circuit and from said first matching circuit to form a filtered picture signal at an output, characterized in that said comb filter arrangement further comprises:
   a second matching circuit also coupled to said input for subjecting said picture signal to amplitude variations and a delay substantially the same as the amplitude variations and the delay in the first matching circuit; and
   a switching circuit for alternately switching on and off a comb filter function of said comb filter arrangement, said switching circuit having outputs coupled, respectively, to a control input of said second matching circuit and to a control input of said delay circuit for alternatively deactivating said second matching circuit and said delay circuit.

9. A video recorder including a comb filter arrangement comprising:
   an input for receiving a picture signal comprising a sequence of individual pixels;
   a delay circuit coupled to said input for subjecting said picture signal to amplitude variations and a delay, said delay circuit having at least two storage cells;

a first matching circuit also coupled to said input for subjecting said picture signal to amplitude variations substantially the same as the amplitude variations in said delay circuit and a delay, a difference between the delay in the delay circuit and the delay in the first matching circuit corresponding to a nominal value; and a superposition stage for superposing output signals from said delay circuit and from said first matching circuit to form a filtered picture signal at an output, characterized in that said comb filter arrangement further comprises:

a second matching circuit also coupled to said input for subjecting said picture signal to amplitude variations and a delay substantially the same as the amplitude variations and the delay in the first matching circuit; and a switching circuit for alternately switching on and off a comb filter function of said comb filter arrangement, said switching circuit having outputs coupled, respectively, to a control input of said second matching circuit and to a control input of said delay circuit for alternatively deactivating said second matching circuit and said delay circuit.

* * * * *